US008502266B2

(12) United States Patent
Kim et al.

(10) Patent No.: US 8,502,266 B2
(45) Date of Patent: Aug. 6, 2013

(54) NITRIDE SEMICONDUCTOR LIGHT EMITTING DEVICE

(75) Inventors: Min-Ho Kim, Gyunggi-do (KR); Martin F. Schubert, Troy, NY (US); Jong Kyu Kim, Watervliet, NY (US); E. Fred Schubert, Troy, NY (US); Yongjo Park, Gyunggi-do (KR); Cheolsoo Sone, Gyunggi-do (KR); Sukho Yoon, Seoul (KR)

(73) Assignees: Samsung Electronics Co., Ltd., Suwon-Si (KR); Rensselaer Polytechnic Institute, Troy, NY (US)

( * ) Notice: Subject to any disclaimer, the term of this patent is extended or adjusted under 35 U.S.C. 154(b) by 190 days.

(21) Appl. No.: 12/923,195

(22) Filed: Sep. 8, 2010

(65) Prior Publication Data
US 2011/0001123 A1    Jan. 6, 2011

Related U.S. Application Data

(62) Division of application No. 12/195,088, filed on Aug. 20, 2008, now abandoned.

(60) Provisional application No. 60/956,723, filed on Aug. 20, 2007.

(51) Int. Cl.
*H01L 33/00*    (2010.01)
(52) U.S. Cl.
USPC .......................................................... 257/103
(58) Field of Classification Search
USPC .......................................................... 257/103
See application file for complete search history.

(56) References Cited

U.S. PATENT DOCUMENTS

| 5,289,486 | A | 2/1994 | Iga et al. |
| 5,583,878 | A | 12/1996 | Shimizu et al. |
| 5,777,350 | A | 7/1998 | Nakamura et al. |
| 6,515,308 | B1* | 2/2003 | Kneissl et al. ................. 257/86 |
| 6,943,381 | B2 | 9/2005 | Gardner et al. |
| 2001/0030317 | A1* | 10/2001 | Lee et al. ........................ 257/13 |

(Continued)

FOREIGN PATENT DOCUMENTS

| JP | 2003-60232 | 2/2003 |
| JP | 2003-347585 | 12/2003 |

(Continued)

OTHER PUBLICATIONS

Japanese Office Action mailed Oct. 11, 2011 issued in corresponding Japanese Patent Application No. 2008-212194.

(Continued)

*Primary Examiner* — Yu-Hsi D Sun

(57) ABSTRACT

A nitride semiconductor light emitting device includes n-type and p-type nitride semiconductor layers, and an active layer disposed between the n-type and p-type nitride semiconductor layers and having a stack structure in which a plurality of quantum barrier layers and one or more quantum well layers are alternately stacked. A net polarization of the quantum barrier layer is smaller than or equal to a net polarization of the quantum well layer. A nitride semiconductor light emitting device can be provided, which can realize high efficiency even at high currents by minimizing the net polarization mismatch between the quantum barrier layer and the quantum well layer. Also, a high-efficiency nitride semiconductor light emitting device can be achieved by reducing the degree of energy-level bending of the quantum well layer.

15 Claims, 9 Drawing Sheets

U.S. PATENT DOCUMENTS

| | | |
|---|---|---|
| 2003/0178702 A1 | 9/2003 | Sawaki et al. |
| 2005/0167690 A1 | 8/2005 | Gardner et al. |
| 2005/0169333 A1 | 8/2005 | Watanabe et al. |
| 2009/0146160 A1 | 6/2009 | Nakahara |

FOREIGN PATENT DOCUMENTS

| | | |
|---|---|---|
| JP | 2005-217415 | 8/2005 |
| JP | 2005-217421 | 8/2005 |
| JP | 2006-324280 | 11/2006 |
| JP | 2007-88270 | 4/2007 |
| JP | 10-2008-0075212 | 8/2008 |

OTHER PUBLICATIONS

U.S. Appl. No. 13/064,186, filed Mar. 9, 2011, Min-Ho Kim et al., Samsung Electro-Mechanics Co., Ltd. and Rensselaer Polytechnic Institute.

U.S. Appl. No. 12/195,088, filed Aug. 20, 2008, Min-Ho Kim et al., Samsung Electro-Mechanics Co., Ltd. and Rensselaer Polytechnic Institute.

U.S. Appl. No. 12/195,077, filed Aug. 20, 2008, Min-Ho Kim et al., Samsung Electro-Mechanics Co., Ltd. and Rensselaer Polytechnic Institute.

U.S. Patent Office Action mailed Oct. 20, 2009 in related U.S. Appl. No. 12/195,077.

Korean Office Action issued on May 17, 2010 in corresponding Korean Patent Application No. 10-2008-0081459.

Korean Office Action issued on May 17, 2010 in corresponding Korean Patent Application No. 10-2008-0081458.

U.S. Patent Office Action mailed Nov. 5, 2009 in corresponding U.S. Appl. No. 12/195,088.

U.S. Patent Office Action mailed Mar. 8, 2010 in corresponding U.S. Appl. No. 12/195,088.

U.S. Patent Office Action mailed Sep. 10, 2010 in corresponding U.S. Appl. No. 12/195,077.

Japanese Office Action dated Sep. 6, 2011 issued in corresponding Japanese Patent Application No. 2008-212193.

Japanese Office Action dated Feb. 28, 2012 issued in related Japanese Patent Application No. 2008-212194.

U.S. Office Action issued in copending U.S. Appl. No. 13/064,186 mailed Jan. 8, 2013.

\* cited by examiner

NITRIDE SEMICONDUCTOR LIGHT EMITTING DEVICE

CROSS-REFERENCE TO RELATED APPLICATIONS

This application is a U.S. divisional application filed under 37 USC 1.53(b) claiming priority benefit of U.S. Ser. No. 12/195,088 filed in the United States on Aug. 20, 2008 now abandoned, which claims earlier priority benefit to U.S. Provisional Application No. 60/956,723 filed on Aug. 20, 2007, the disclosures of which are incorporated herein by reference.

BACKGROUND

1. Field

The present invention relates to a nitride semiconductor light emitting device, and more particularly, to a nitride semiconductor light emitting device capable of minimizing a decrease in light-emission efficiency at high currents.

2. Description of the Related Art

A semiconductor light emitting diode (LED) is a semiconductor device that can emit light of various colors due to electron-hole recombination occurring at a p-n junction when a current is applied thereto. Compared to conventional lighting sources such as incandescent lighting bulbs and fluorescent lamps, LED has many advantages such as a long lifespan, low power, excellent initial-operation characteristics, and high tolerance to repetitive power on/off. Hence the demand for LED is continuously increasing. Particularly, group III nitride semiconductors that can emit light in the blue/short wavelength region have recently drawn much attention.

As shown in FIG. 1, a group III nitride semiconductor light emitting device has high efficiency at low currents. However, at high currents, a significant decrease in quantum efficiency, which is called efficiency droop, occurs in the group III nitride semiconductor light emitting device. The efficiency droop is becoming a more crucial limitation as LEDs are increasingly used at high currents as in lighting devices. However, no methods have been proposed to completely solve this limitation associated with the efficiency droop. Therefore, there is a need for a high-efficiency nitride semiconductor light emitting device that achieves high quantum efficiency even at high currents and thus is applicable to a lighting device or the like.

SUMMARY

An aspect of the present invention provides a nitride semiconductor light emitting device capable of achieving high efficiency even at high currents by minimizing a net polarization mismatch between a quantum barrier layer and a quantum well layer.

According to an aspect of the present invention, there is provided a nitride semiconductor light emitting device including: n-type and p-type nitride semiconductor layers; and an active layer disposed between the n-type and p-type nitride semiconductor layers and having a stack structure in which a plurality of quantum barrier layers and one or more quantum well layers are alternately stacked. A net polarization of the quantum barrier layer is smaller than or equal to a net polarization of the quantum well layer.

A net polarization mismatch at an interface between the quantum barrier layer and the quantum well layer may be smaller than a net polarization mismatch between GaN and $In_xGa_{(1-x)}N$ ($0.15 \leq x \leq 0.25$). The net polarization mismatch at the interface between the quantum barrier layer and the quantum well layer may be smaller than half the net polarization mismatch between GaN and $In_xGa_{(1-x)}N$ ($0.15 \leq x \leq 0.25$).

A net polarization mismatch at an interface between the quantum barrier layer and the quantum well layer may be smaller than a net polarization mismatch between GaN and $In_xGa_{(1-x)}N$ ($0.15 \leq x \leq 0.25$). The net polarization mismatch at the interface between the quantum barrier layer and the quantum well layer may be smaller than half the net polarization mismatch between GaN and $In_xGa_{(1-x)}N$ ($0.3 \leq x \leq 0.4$).

A net polarization mismatch at an interface between the quantum barrier layer and the quantum well layer may be smaller than a net polarization mismatch between GaN and $In_xGa_{(1-x)}N$ ($0 \leq x \leq 0.1$). The net polarization mismatch at the interface between the quantum barrier layer and the quantum well layer may be smaller than half the net polarization mismatch between GaN and $In_xGa_{(1-x)}N$ ($0 \leq x \leq 0.1$).

A quantum barrier layer and a quantum well layer adjacent to each other in the active layer may have the same net polarization.

The quantum barrier layer may have bandgap energy of the same magnitude as that of GaN. The quantum barrier layer may have bandgap energy which is smaller than that of GaN and greater than that of $In_{0.2}Ga_{0.8}N$.

A quantum barrier layer contacting the n-type nitride semiconductor layer among the plurality of quantum barrier layers may have an n-type doped interface with the n-type nitride semiconductor layer. The interface of the quantum barrier layer is Si delta-doped.

A quantum barrier layer contacting the p-type nitride semiconductor layer among the plurality of quantum barrier layers may have a p-type doped interface with the p-type nitride semiconductor layer. The interface of the quantum barrier layer may be Mg delta-doped.

The nitride semiconductor light emitting device may further include an electron blocking layer disposed between the active layer and the p-type nitride semiconductor layer.

The nitride semiconductor light emitting device may further include a substrate for growth contacting the n-type nitride semiconductor layer. The n-type nitride semiconductor layer may be disposed on a polar surface of the substrate. The n-type nitride semiconductor layer may be disposed on a C (0001) plane of a sapphire substrate.

At least one of the plurality of quantum barrier layers may have a superlattice structure. The quantum barrier layer having the superlattice structure may have a structure in which first and second layers respectively formed of $In_{0.1}Ga_{0.9}N$ and GaN are alternately stacked.

According to another aspect of the present invention, there is provided a nitride semiconductor light emitting device including: n-type and p-type nitride semiconductor layers; and an active layer disposed between the n-type and p-type nitride semiconductor layers and having a structure in which a plurality of quantum barrier layers and one or more quantum well layers are alternately stacked, wherein at least one of the quantum well layers has a constant energy level of a conduction band.

BRIEF DESCRIPTION OF THE DRAWINGS

The above and other aspects, features and other advantages of the present invention will be more clearly understood from the following detailed description taken in conjunction with the accompanying drawings, in which.

DESCRIPTION OF EMBODIMENTS

Figure 1:
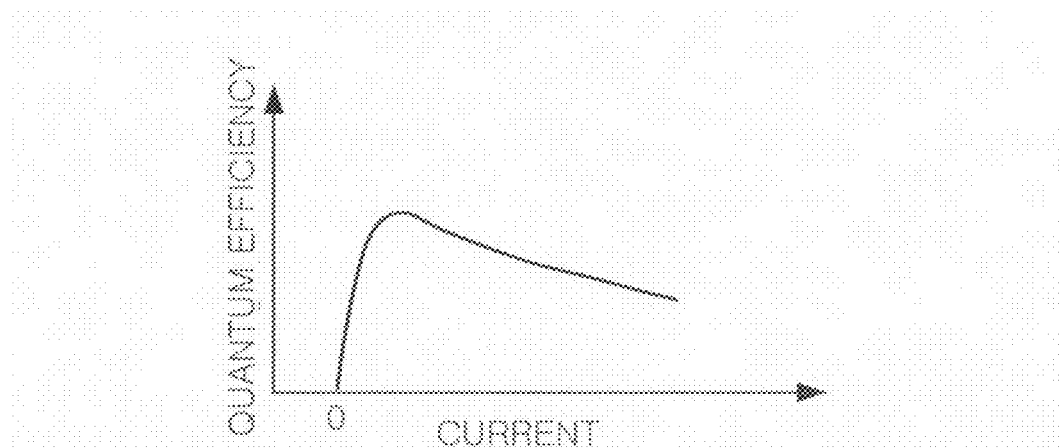
FIG. 1 is a graph showing a relation between a current and quantum efficiency in a related art nitride semiconductor light emitting device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions and the shapes of elements are exaggerated for clarity of illustration. Like reference numerals refer to like elements throughout.

Figure 2A:
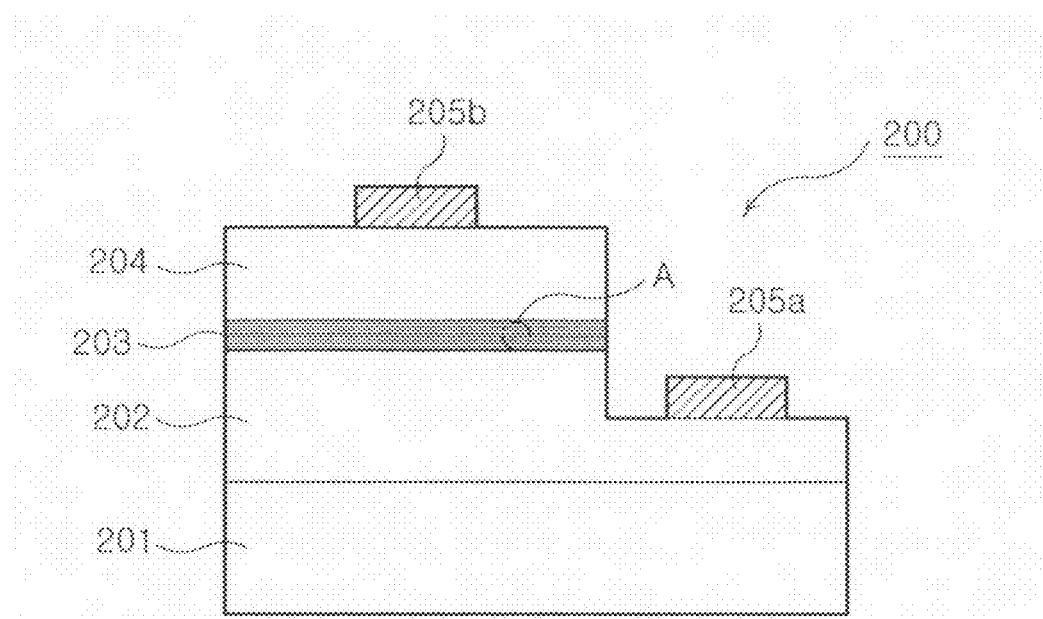
FIG. 2A is a cross-sectional view of a nitride semiconductor light emitting device according to an exemplary embodiment of the present invention.
Figure 2B:
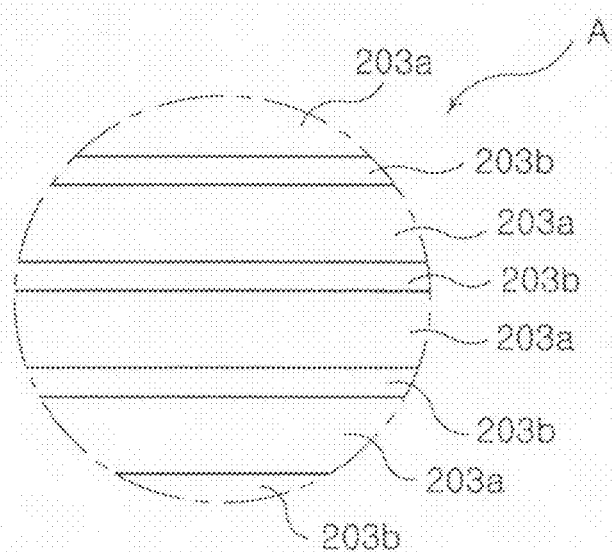
FIG. 2B is an enlarged view of an active layer region of FIG. 2A.

FIG. 2A is a cross-sectional view of a nitride semiconductor light emitting device according to an exemplary embodiment of the present invention. FIG. 2B is an enlarged view of an active layer region of FIG. 2A. Referring to FIG. 2A, a nitride semiconductor light emitting device 200 includes an n-type nitride semiconductor layer 202, an active layer 203 and a p-type nitride semiconductor layer 204 sequentially disposed on a substrate 201. N-type and p-type electrodes 205a and 205b are disposed at predetermined regions of the n-type and p-type nitride semiconductor layers 202 and 204, respectively.

The substrate 201 is provided for growth of a nitride semiconductor layer, and a sapphire substrate may be used as the substrate 201. The sapphire substrate is formed of a crystal having Hexa-Rhombo R3c symmetry, and has a lattice constant of 13.001 Å along a C-axis and a lattice constant of 4.758 Å along an A-axis. Orientation planes of the sapphire substrate include a C (0001) plane, an A (1120) plane, an R (1102) plane, etc. Particularly, the C plane is mainly used as a substrate for nitride growth because it relatively facilitates the growth of a nitride film and is stable at a high temperature.

The C plane is a polar plane. A nitride semiconductor layer grown from the C plane has a spontaneous polarization because of intrinsic ionicity of a nitride semiconductor and structural asymmetry (lattice constant aft). If nitride semiconductors having different lattice constants are successively stacked, a strain occurring at each semiconductor layer causes a piezoelectric polarization. The sum of the two polarizations is called a net polarization. Net polarization mismatch is formed at each interface by the net polarization, thereby bending the energy-level. The energy-level bending in an active layer causes spatial mismatch between wave functions of electrons and holes, lowering the light-emission efficiency. A technique for improving the light-emission efficiency by reducing an influence of polarization will be described in detail. Instead of the sapphire substrate, a substrate formed of SiC, Si, GaN, AlN or the like may be used as the substrate 201 for growth of a nitride semiconductor.

In the current embodiment, a nitride semiconductor LED having a horizontal structure including the substrate 201 for growth of a nitride semiconductor is described. However, the present invention is not limited thereto and may be applied to a nitride semiconductor light emitting device having a vertical structure in which electrodes face each other in a stacked direction of semiconductor layers with the substrate 201 removed.

The n-type nitride semiconductor layer 202 and the p-type nitride semiconductor layer 204 may be formed of semiconductor materials having a composition formula $Al_xIn_yGa_{(1-x-y)}N$ ($0 \leq x \leq 1$, $0 \leq y \leq 1$ and $0 \leq x+y \leq 1$) and doped with n-type impurities and p-type impurities, respectively. Representative examples of the semiconductor material include GaN, AlGaN and InGaN. Si, Ge, Se, Te or the like may be used as the n-type impurities, and Mg, Zn, Be or the like may be used as the p-type impurities. With respect to growth of a nitride semiconductor layer, a known process may be used for the n-type and p-type nitride semiconductor layers 202 and 204. The known process may be, e.g., metal-organic chemical vapor deposition (MOCVD), molecular beam epitaxy (MBE) or hydrid vapor-phase epitaxy (HVPE).

As shown in FIG. 2B, the active layer 203 has a stack structure in which quantum barrier layers 203a and quantum well layers 203b are alternately stacked on top of each other so as to emit light through electron-hole recombination at quantum well layers 203b. The quantum barrier layer 203a may be formed of $Al_xIn_yGa_{(1-x-y)}N$ ($0 \leq x \leq 1$, $0 \leq x \leq 1$ and $0 \leq x+y \leq 1$). The quantum well layer 203b may be formed of $In_zGa_{(1-z)}N$ ($0 \leq z \leq 1$). Particularly, according to the current embodiment, a net polarization mismatch at an interface between the quantum barrier layer 203a and the quantum well layer 203b is smaller than that at an interface of a general quantum barrier layer/general quantum well layer structure. Thus, the energy-level bending of the quantum well layer 203b can be reduced. In this case, the general quantum barrier layer/general quantum well layer structure may be, e.g., GaN/$In_{0.2}Ga_{0.8}N$.

Figure 3:
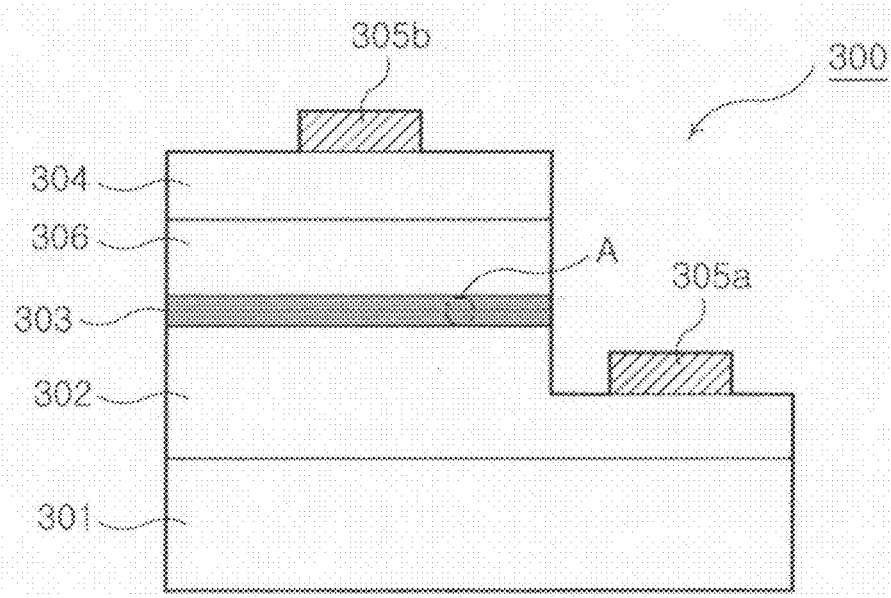
FIG. 3 is a cross-sectional view of a nitride semiconductor light emitting device according to another exemplary embodiment of the present invention.

FIG. 3 is a cross-sectional view of a nitride semiconductor light emitting device according to another exemplary embodiment of the present invention. Referring to FIG. 3, as in the structure of FIG. 2, a nitride semiconductor light emitting device 300 according to the current embodiment includes a substrate 301, an n-type nitride semiconductor layer 302, an active layer 303, a p-type nitride semiconductor layer 304, and n-type and p-type electrodes 305a and 305b. The nitride semiconductor light emitting device 300 further includes an electron blocking layer 306. The electron blocking layer 306 is formed between the active layer 303 and the p-type nitride semiconductor layer 304, and is formed of $Al_xGa_{(1-x)}N$ ($0<x\leq1$), thereby having a high energy level and thus preventing electron overflow.

Figure 4:
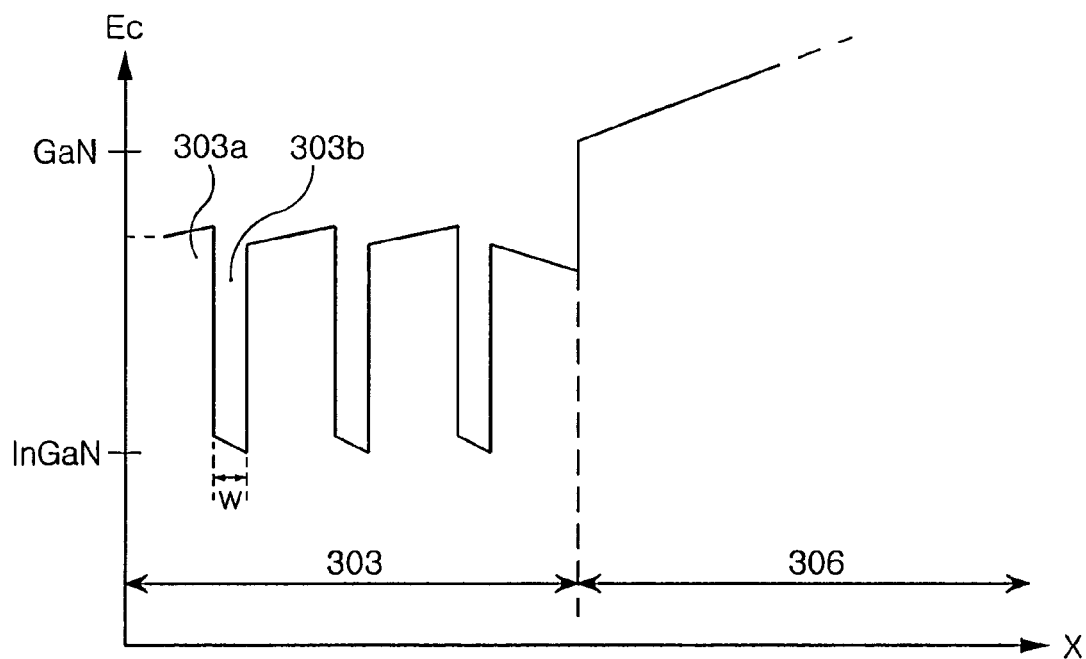
FIG. 4 is a graph showing a conduction band energy level of an active layer region of the nitride semiconductor light emitting device of FIG. 3.

FIG. 4 shows a conduction band energy level in an active layer region of a nitride semiconductor light emitting device having a structure of FIG. 3. Referring to FIG. 4, an energy-level is bent at a quantum barrier layer 303a and a quantum well layer 303b because of the net polarization mismatch. The quantum well layer 303b may be formed of In0.2Ga0.8N used in a general blue light emitting device. According to the current embodiment, the quantum barrier layer 303a has a lower energy level and a higher net polarization as compared to GaN. Accordingly, the net polarization mismatch at an interface between the quantum barrier layer 303a and the quantum well layer 303b of $In_{0.2}Ga_{0.8}N$ is smaller than that in the case of forming the quantum barrier layer of GaN.

As the net polarization mismatch decreases, the degree of the energy-level bending in the conduction band quantum well layer 303b, that is, the gradient (dEc/dx) of the energy level can be reduced as shown in FIG. 4. Accordingly, recombination efficiency of carriers can be improved, and excellent characteristics of little current dependency of an emission wavelength can be realized, unlike a related nitride semiconductor light emitting device in which a blue shift of an emission wavelength occurs as the current increases. In this case, considering the fact that the magnitude of a polarization potential caused by the net polarization mismatch in the GaN/$In_{0.2}Ga_{0.8}N$ structure is about 0.1 V/nm×W with respect to a thickness (W) of a quantum well layer, the energy-level bending can be reduced by decreasing the magnitude of the polarization potential below two third of 0.1 V/nm×W. Hereinafter, a method for reducing the net polarization mismatch between quantum barrier and quantum well layers, and effects thereof will now be described.

Figure 5:
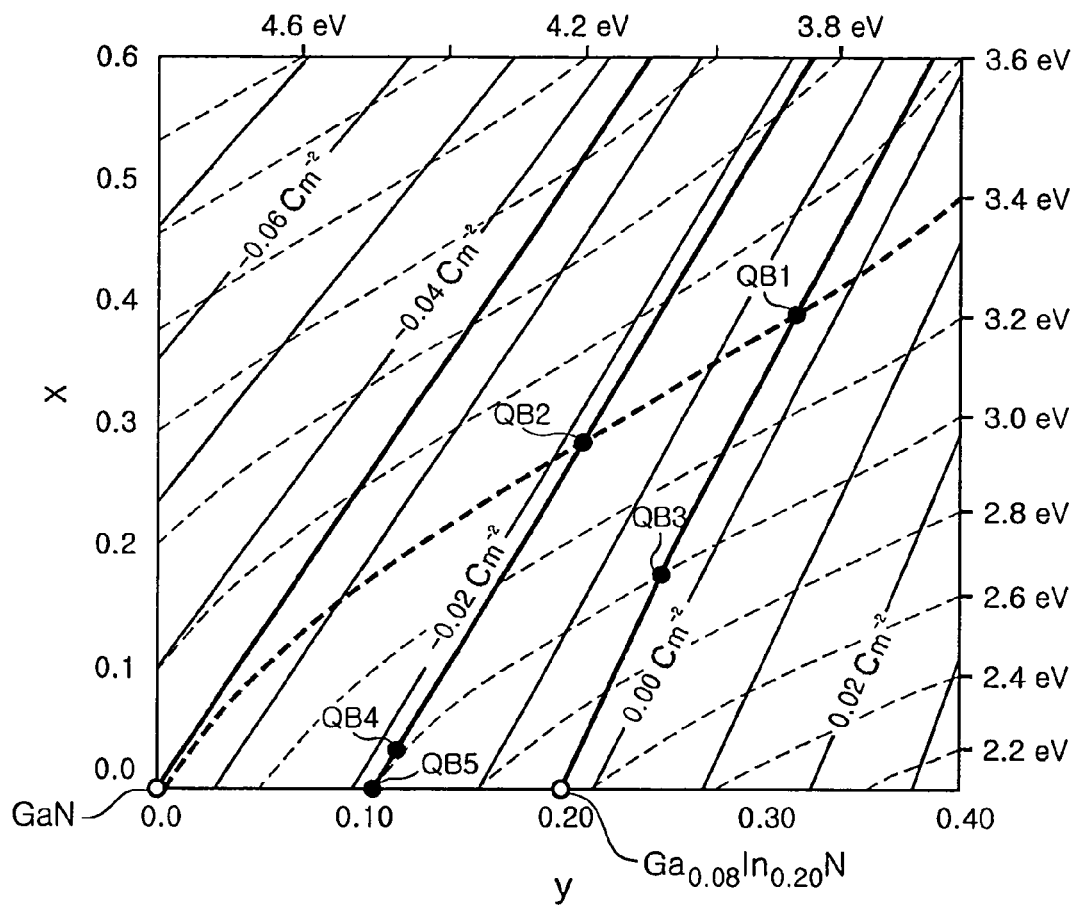
FIG. 5 illustrates changes in bandgap energy and net polarization according to the Al(x) composition and In(y) composition in a AlInGaN quaternary semiconductor.

FIG. 5 is a graph showing changes in bandgap energy and net polarization according to Al(x) and In(y) compositions in an AlInGaN quaternary semiconductor. In FIG. 5, the compositions of the same bandgap energy are indicated by a dotted line, and the compositions of the same net polarization are indicated by a solid line. The graph of FIG. 5 is obtained from a calculation considering a bowing parameter and a lattice constant of each element after determining the net polarization and the bandgap energy of AlN, InN and GaN grown on the GaN layer at a temperature of 300 K.

Referring to FIG. 5, as an AlInGaN semiconductor layer increases in the Al content, the bandgap energy increases and the net polarization decreases. Also, as the In content of the AlInGaN semiconductor layer increases, the bandgap energy decreases and the net polarization increases. However, degrees of changes in the bandgap energy and the net polarization vary according to changes in the Al and In contents. Thus, it can be seen that if the Al and In contents are properly controlled, the net polarization can be reduced while the constant bandgap energy is maintained.

In more detail, as shown in FIG. 5, a related art GaN quantum barrier layer has the bandgap energy of 3.4200 eV and the net polarization of −0.0339 C/m². In the current embodiment, quantum barrier layers QB1 to QB5 (also referred to as QB1 to QB5 quantum barrier layers) are formed by determining five compositions such that the net polarization mismatch with a quantum well layer can be reduced while carrier confinement is maintained by making the bandgap energy similar to that of GaN. Table 1 below shows the bandgap energy and calculation results of net polarizations in the five quantum barrier layers QB1 to QB5, as well as the bandgap energy and calculation results of net polarizations in a related art GaN quantum barrier layer and a related art $In_{0.2}Ga_{0.8}N$ quantum well layer.

The QB1 quantum barrier layer ($Al_{0.4}In_{0.33}Ga_{0.27}N$) has the same bandgap energy as GaN and the same net polarization as the $In_{0.2}Ga_{0.8}N$ quantum well layer. The QB2 quantum barrier layer ($Al_{0.29}In_{0.21}Ga_{0.8}N$) has the same bandgap energy as GaN and has a net polarization mismatch with the $In_{0.2}Ga_{0.8}N$ quantum well layer, which is half the net polarization mismatch between GaN and the $In_{0.2}Ga_{0.8}N$ quantum well layer. Also, the QB3, QB4 and QB5 quantum barrier layers having different compositions are selected, which have lower bandgap energy than GaN and a reduced net polarization mismatch with the $In_{0.2}Ga_{0.8}N$ quantum well layer as compared to the net polarization mismatch between GaN and the $In_{0.2}Ga_{0.8}N$ quantum well layer. In Table 1, CQB represents a related art quantum barrier layer, and CQW represents a related art quantum well layer.

TABLE 1

| composition | bandgap energy (eV) | net polarization (C/m²) |
|---|---|---|
| QB1 | $Al_{0.4}In_{0.33}Ga_{0.27}N$ | 3.4200 | −0.0031 |
| QB2 | $Al_{0.29}In_{0.21}Ga_{0.5}N$ | 3.4200 | −0.0185 |
| QB3 | $Al_{0.19}In_{0.26}Ga_{0.55}N$ | 3.0335 | −0.0031 |
| QB4 | $Al_{0.05}In_{0.26}Ga_{0.83}N$ | 3.0335 | −0.0185 |
| QB5 | $In_{0.10}Ga_{0.9}N$ | 2.9814 | −0.0185 |
| CQB | GaN | 3.4200 | −0.0339 |
| CQW | $In_{0.2}Ga_{0.8}N$ | 2.647 | −0.0031 |

In the previous example, the $In_{0.2}Ga_{0.8}N$ quantum well layer is used. However, an $In_xGa_{(1-x)}N$ ($0.15\leq x\leq0.25$) quantum well layer may be used in a blue light emitting device, an $In_xGa_{(1-x)}N$ ($0.3\leq x\leq0.4$) quantum well layer may be used in a green light emitting device, and an $In_xGa_{(1-x)}N$ ($0\leq x\leq0.1$) quantum well layer may be used in an ultraviolet light emitting device. Each of those quantum barrier layers may be determined by the same principle described above with reference to FIG. 5.

Figure 6:
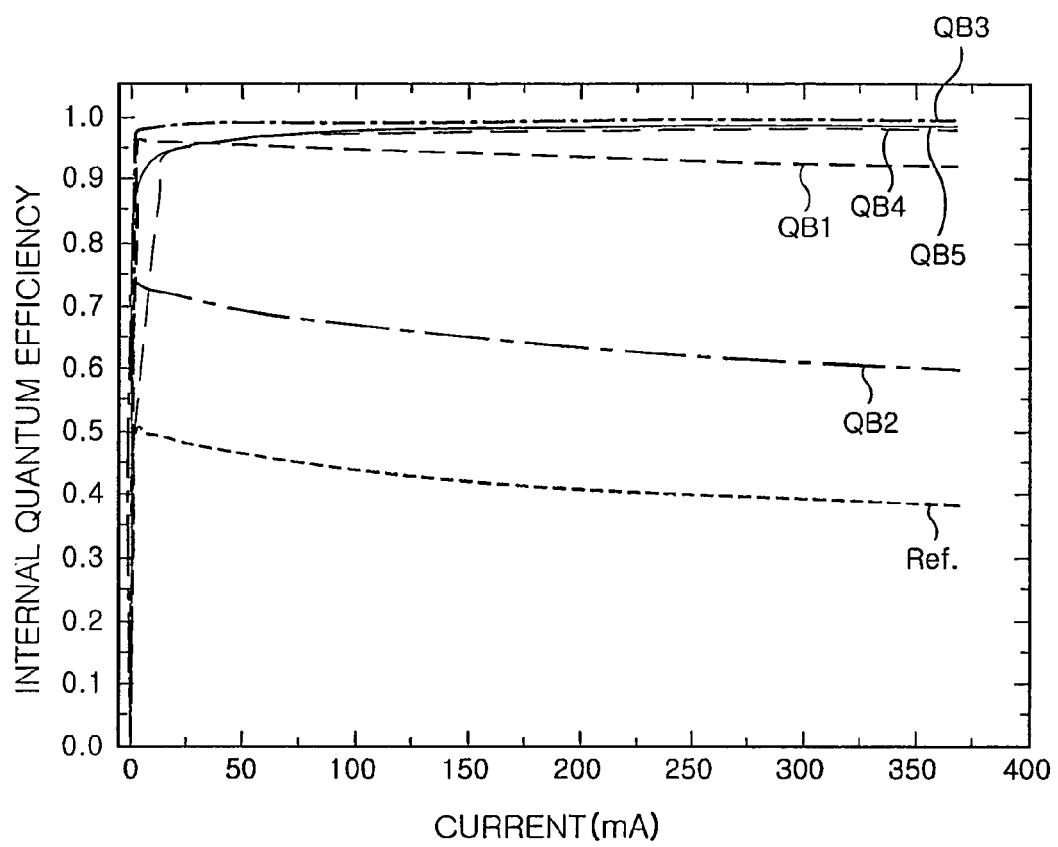
FIG. 6 is a graph showing a simulation result of internal quantum efficiency with respect to a current change in quantum barrier layers having five exemplary compositions(QB1 to QB5) and a comparison example (a GaN quantum barrier layer) as shown in Table 1.
Figure 7:
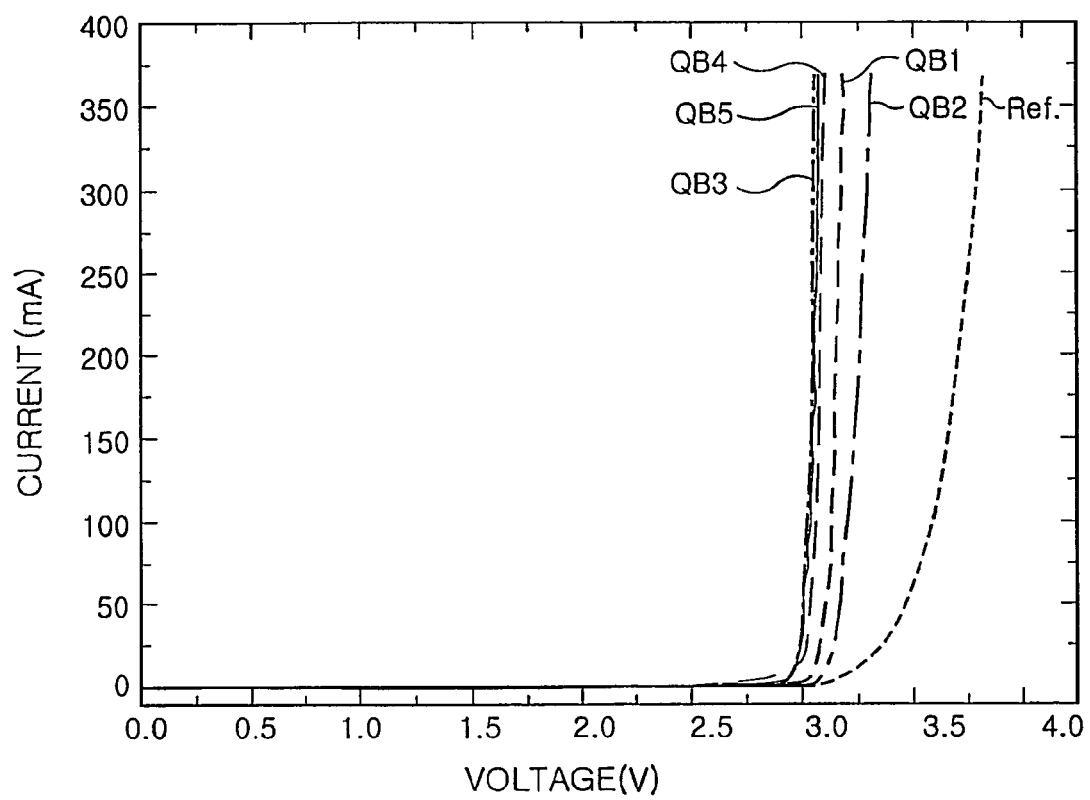
FIG. 7 illustrates a relation between a driving voltage and a current.

FIG. 6 is a graph showing a simulation result of internal quantum efficiency according to a current change in quantum barrier layers having the five exemplary compositions (QB1 to QB5) and the comparison example (a GaN quantum barrier layer) as shown in Table 1. FIG. 7 shows a relation between a driving voltage and a current. In this case, the emission wavelength is 450 nm, and the temperature condition is set to 300 K. Influences of a crystalline feature of the semiconductor layer are not considered.

Referring to FIG. 6, when the quantum barrier layers QB1 to QB5 selected in the current embodiment are used, it can be seen that the internal quantum efficiency is significantly improved as compared to the GaN quantum barrier layer Ref. The internal quantum efficiency is particularly excellent in the quantum barrier layers QB3 to QB5 where the Al and In contents are relatively low. Also, in the case of the internal quantum efficiency at high currents, the quantum efficiency decreases by about 25% at 350 mA as compared to the maximum quantum efficiency. However, according to the current embodiment, the quantum efficiency decreases by only about 5%, and this reveals that limitations of the related art caused by the high currents can be overcome. This effect is achieved because the energy-level bending of the quantum well layer decreases due to a decrease in the net polarization mismatch between the quantum barrier layer and the quantum well layer. Referring to FIG. 7, the driving voltage significantly decreases when the quantum barrier layers QB1 to QB5 according to the current embodiment are used as compared to when the related art GaN quantum barrier layer Ref. is used.

A method for controlling Al and In contents is described according to the current embodiment. However, this method is merely one way of reducing the net polarization mismatch between the quantum barrier layer and the quantum well layer or of reducing the degree of the energy-level bending of the quantum well layer, and the present invention is not limited thereto.

Figure 8A:
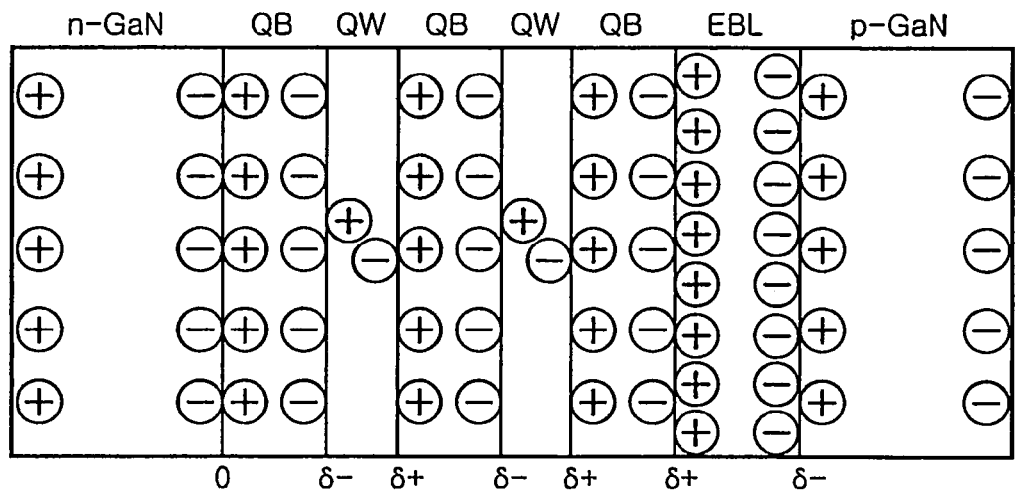
FIG. 8A is a schematic diagram showing a net polarization in an active layer region of a related art nitride semiconductor light emitting structure.
Figure 8B:
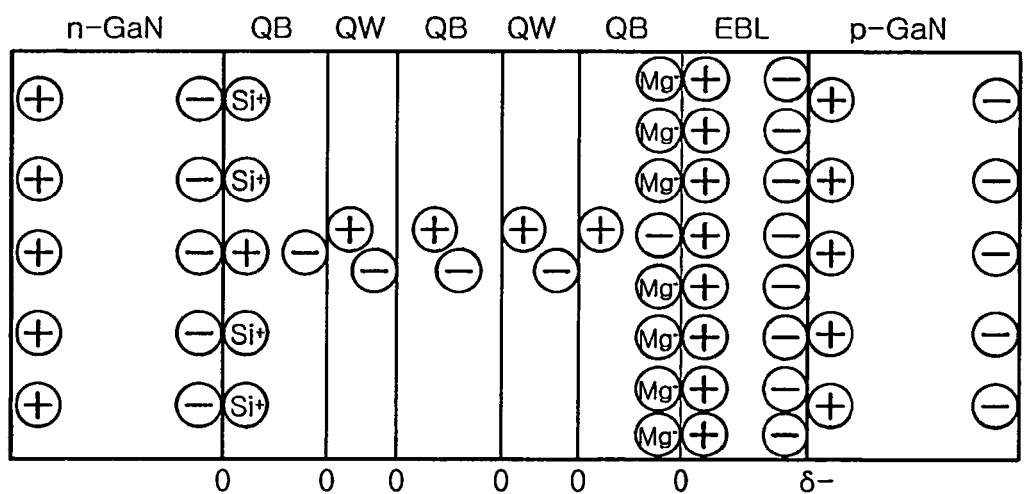
FIG. 8B is a schematic diagram showing a net polarization in an active layer region of a nitride semiconductor light emitting structure according to the present invention.

If the net polarization mismatch is reduced at an interface between the quantum barrier layer and the quantum well layer, an undesired net polarization mismatch may occur with respect to another adjacent layer. To prevent this undesired net polarization mismatch, delta doping may be used. FIG. 8A is a schematic diagram illustrating the net polarization in an active layer region of a related art nitride semiconductor light emitting structure. FIG. 8B is a schematic diagram illustrating the net polarization in an active layer region of a nitride semiconductor light emitting structure according to the present invention. Referring to FIG. 8A, a quantum barrier layer QB and a quantum well layer QW have different net polarizations. The net polarizations may be set to be equal to each other as in the present invention. However, if the net polarization of the quantum barrier layer QB is increased to obtain such equal net polarization, a net polarization mismatch with an adjacent n-type nitride semiconductor layer n-GaN or an electron blocking layer EBL may occur, which lowers the light emission efficiency.

Therefore, as shown in FIG. 8B, an interface between the n-type nitride semiconductor layer n-GaN and the adjacent quantum barrier layer QB may be Si delta-doped in due consideration of the interface between the quantum barrier layer QB and the quantum well layer QW and the relation with other adjacent layers. Similarly, an interface of the quantum barrier layer QB adjacent to the electron blocking layer EBL may be Mg delta-doped. If the electron blocking layer does not exist, an interface of the quantum barrier layer QB adjacent to a p-type nitride semiconductor layer p-GaN may be Mg delta-doped. Accordingly, the net polarization becomes equal in each interface of the entire light emitting structure, so that the light emission efficiency can be further improved.

Figure 9:
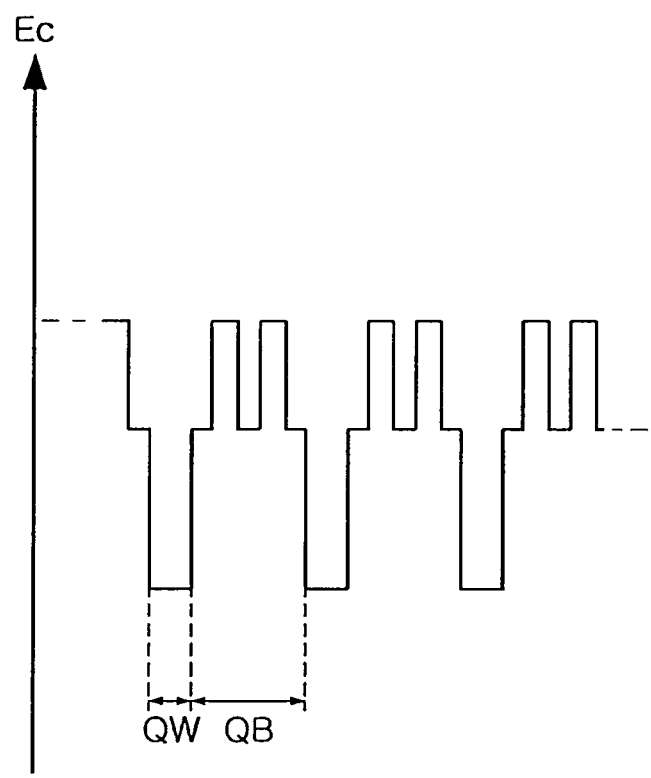
FIG. 9 illustrates a conduction band energy level of a modification version of the quantum barrier layer of FIG. 3.
Figure 10:
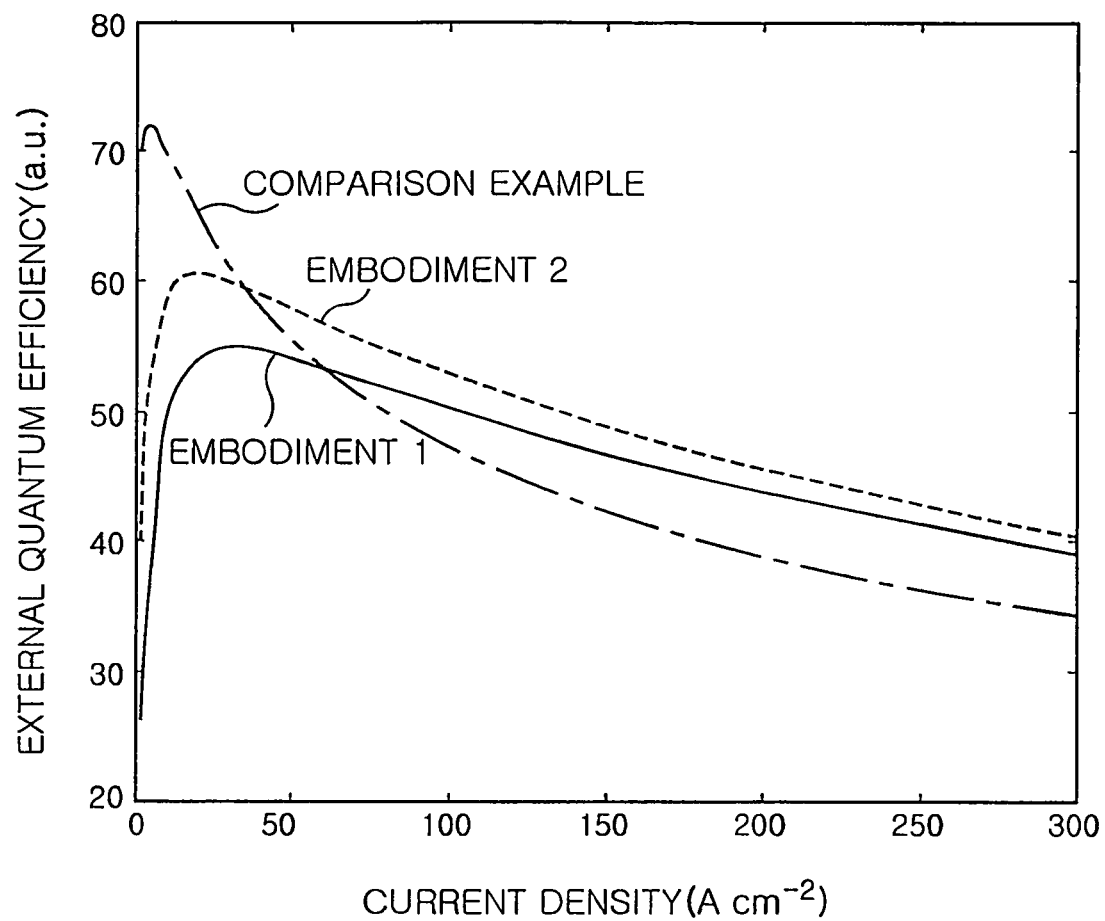
FIG. 10 is a graph showing a change in external quantum efficiency according to a current density (chip size 1 mm 2) to explain characteristics of a light emitting device having a structure of FIG. 9.

FIG. 9 is a diagram showing a conduction band energy level of a modification version of the quantum barrier layer of FIG. 3. According to the current embodiment, a quantum barrier layer QB has a superlattice structure. As one example of the superlattice structure, a structure in which first and second layers respectively formed of $In_{0.1}Ga_{0.9}N$ and GaN are alternately stacked may be used. The first layer corresponds to the QB5 quantum barrier layer of FIG. 5. Also, any one of the QB1 to QB4 quantum barrier layers of FIG. 5 may be used as the first layer. FIG. 10 is a graph showing changes in external quantum efficiency with respect to the current density (chip size: 1 mm$^2$) to explain characteristics of a light emitting device having a structure of FIG. 9. In FIG. 10, 'embodiment 2' corresponds to the structure of FIG. 9, 'comparison example' corresponds to a GaN quantum barrier layer/$In_{0.2}Ga_{0.8}N$ quantum well layer structure, and 'embodiment 1' corresponds to an $In_{0.1}Ga_{0.8}N$ quantum barrier layer/$In_{0.2}Ga_{0.8}N$ quantum well layer structure. Referring to FIG. 10, it can be seen that the embodiments 1 and 2 achieve higher efficiency at high currents as compared to the comparison example. Particularly, the embodiment 2 using the superlattice structure achieves higher efficiency than the embodiment 1.

According to the present invention, a nitride semiconductor light emitting device can be provided, which can realize high efficiency even at high currents by minimizing the net polarization mismatch between the quantum barrier layer and the quantum well layer. Also, a high-efficiency nitride semiconductor light emitting device can be achieved by reducing the degree of energy-level bending of the quantum well layer.

While the present invention has been shown and described in connection with the exemplary embodiments, it will be apparent to those skilled in the art that modifications and variations can be made without departing from the spirit and scope of the invention as defined by the appended claims

What is claimed is:

1. A nitride semiconductor light emitting device comprising:
   n-type and p-type nitride semiconductor layers; and
   an active layer disposed between the n-type and p-type nitride semiconductor layers and having a stack structure in which a plurality of quantum barrier layers and a plurality of quantum well layers having bandgap energy lower than that of the plurality of quantum barrier layers are alternately stacked,
   wherein the absolute value of a net polarization mismatch at an interface between one of the plurality of quantum barrier layers and the quantum well layer adjacent thereto is smaller than the absolute value of a net polarization mismatch between GaN and the quantum well layer adjacent to the one of the plurality of quantum barrier layers,
   at least one of the plurality of quantum barrier layers has a superlattice structure in which first and second layers respectively formed of InGaN and GaN are alternately stacked, the first and second layers having larger bandqap energy than those of the plurality of quantum well layers, and
   at least one of the quantum barrier layers having the superlattice structure is disposed between two of the quantum well layers.

2. The nitride semiconductor light emitting device of claim 1, wherein the absolute value of a net polarization mismatch at an interface between the quantum barrier layer and the quantum well layer is smaller than the absolute value of a net polarization mismatch between GaN and InxGa(1-x)N ($0.15 \leq x \leq 0.25$).

3. The nitride semiconductor light emitting device of claim 2, wherein the absolute value of the net polarization mismatch at the interface between the quantum barrier layer and the quantum well layer is smaller than half the absolute value of the net polarization mismatch between GaN and InxGa(1-x)N ($0.15 \leq x \leq 0.25$).

4. The nitride semiconductor light emitting device of claim 1, wherein the absolute value of a net polarization mismatch at an interface between the quantum barrier layer and the quantum well layer is smaller than the absolute value of a net polarization mismatch between GaN and InxGa(1-x)N ($0.3 \leq x \leq 0.4$).

5. The nitride semiconductor light emitting device of claim 4, wherein the absolute value of the net polarization mismatch at the interface between the quantum barrier layer and the quantum well layer is smaller than half the absolute value of the net polarization mismatch between GaN and InxGa(1-x)N ($0.3 \leq x \leq 0.4$).

6. The nitride semiconductor light emitting device of claim 1, wherein the absolute value of a net polarization mismatch at an interface between the quantum barrier layer and the quantum well layer is smaller than the absolute value of a net polarization mismatch between GaN and $In_xGa_{(1-x)}N$ ($0 \leqq x \leqq 0.1$).

7. The nitride semiconductor light emitting device of claim 6, wherein the absolute value of the net polarization mismatch at the interface between the quantum barrier layer and the quantum well layer is smaller than half the absolute value of the net polarization mismatch between GaN and $In_xGa_{(1-x)}N$ ($0 \leqq x \leqq 0.1$).

8. The nitride semiconductor light emitting device of claim 1, wherein a quantum barrier layer and a quantum well layer adjacent to each other in the active layer have the same net polarization.

9. The nitride semiconductor light emitting device of claim 1, wherein the quantum barrier layer has bandgap energy of the same magnitude as that of GaN.

10. The nitride semiconductor light emitting device of claim 1, wherein a quantum barrier layer contacting the n-type nitride semiconductor layer among the plurality of quantum barrier layers has an n-type doped interface with the n-type nitride semiconductor layer.

11. The nitride semiconductor light emitting device of claim 10, wherein the interface of the quantum barrier layer is Si delta-doped.

12. The nitride semiconductor light emitting device of claim 1, wherein a quantum barrier layer contacting the p-type nitride semiconductor layer among the plurality of quantum barrier layers has a p-type doped interface with the p-type nitride semiconductor layer.

13. The nitride semiconductor light emitting device of claim 12, wherein the interface of the quantum barrier layer is Mg delta-doped.

14. The nitride semiconductor light emitting device of claim 1, further comprising a substrate for growth contacting the n-type nitride semiconductor layer,
wherein the n-type nitride semiconductor layer is disposed on a polar surface of the substrate.

15. The nitride semiconductor light emitting device of claim 14, wherein the n-type nitride semiconductor layer is disposed on a C (0001) plane of a sapphire substrate.

\* \* \* \* \*

UNITED STATES PATENT AND TRADEMARK OFFICE
CERTIFICATE OF CORRECTION

| | | |
|---|---|---|
| PATENT NO. | : 8,502,266 B2 | Page 1 of 1 |
| APPLICATION NO. | : 12/923195 | |
| DATED | : August 6, 2013 | |
| INVENTOR(S) | : Min-Ho Kim et al. | |

It is certified that error appears in the above-identified patent and that said Letters Patent is hereby corrected as shown below:

In the Claims

In Col. 8, Line 36, In Claim 1, delete "bandqap" and insert -- bandgap --, therefor.

Signed and Sealed this
Twelfth Day of November, 2013

Teresa Stanek Rea
*Deputy Director of the United States Patent and Trademark Office*